United States Patent [19]
Brown et al.

[11] 3,988,613

[45] Oct. 26, 1976

[54] RADIATION SENSING AND CHARGE STORAGE DEVICES

[75] Inventors: Dale M. Brown, Schenectady; Mario Ghezzo, Ballston Lake; Marvin Garfinkel, Schenectady, all of N.Y.

[73] Assignee: General Electric Company, Schenectady, N.Y.

[22] Filed: May 2, 1975

[21] Appl. No.: 573,842

[52] U.S. Cl. .............................. 250/211 J; 250/209; 250/211 R; 357/23; 357/30
[51] Int. Cl.[2] .......................................... H01L 27/14
[58] Field of Search ............. 250/211 R, 211 J, 209; 357/23, 24, 30

[56] References Cited
UNITED STATES PATENTS

| | | | |
|---|---|---|---|
| 3,760,240 | 9/1973 | Bergt | 357/30 |
| 3,805,062 | 4/1974 | Michon et al. | 250/211 J |
| 3,935,446 | 1/1976 | Michon | 250/211 J |
| 3,949,223 | 4/1976 | Schmit et al. | 250/211 J |

Primary Examiner—Eugene La Roche
Attorney, Agent, or Firm—Julius J. Zaskalicky; Joseph T. Cohen; Jerome C. Squillaro

[57] ABSTRACT

An array of radiation sensing devices, each including a pair of conductor-insulator-semiconductor capacitors, arranged in rows and columns in which the row stripes or lines form row connected capacitors in relation to selected surface regions of a semiconductor substrate and in which the column stripes or lines form column connected capacitors in relation to the selected surface regions. Each of the row stripes overlies first portions of the selected surface regions of a respective row. Each of the column stripes overlies entirely the selected surface regions of a respective column.

11 Claims, 6 Drawing Figures

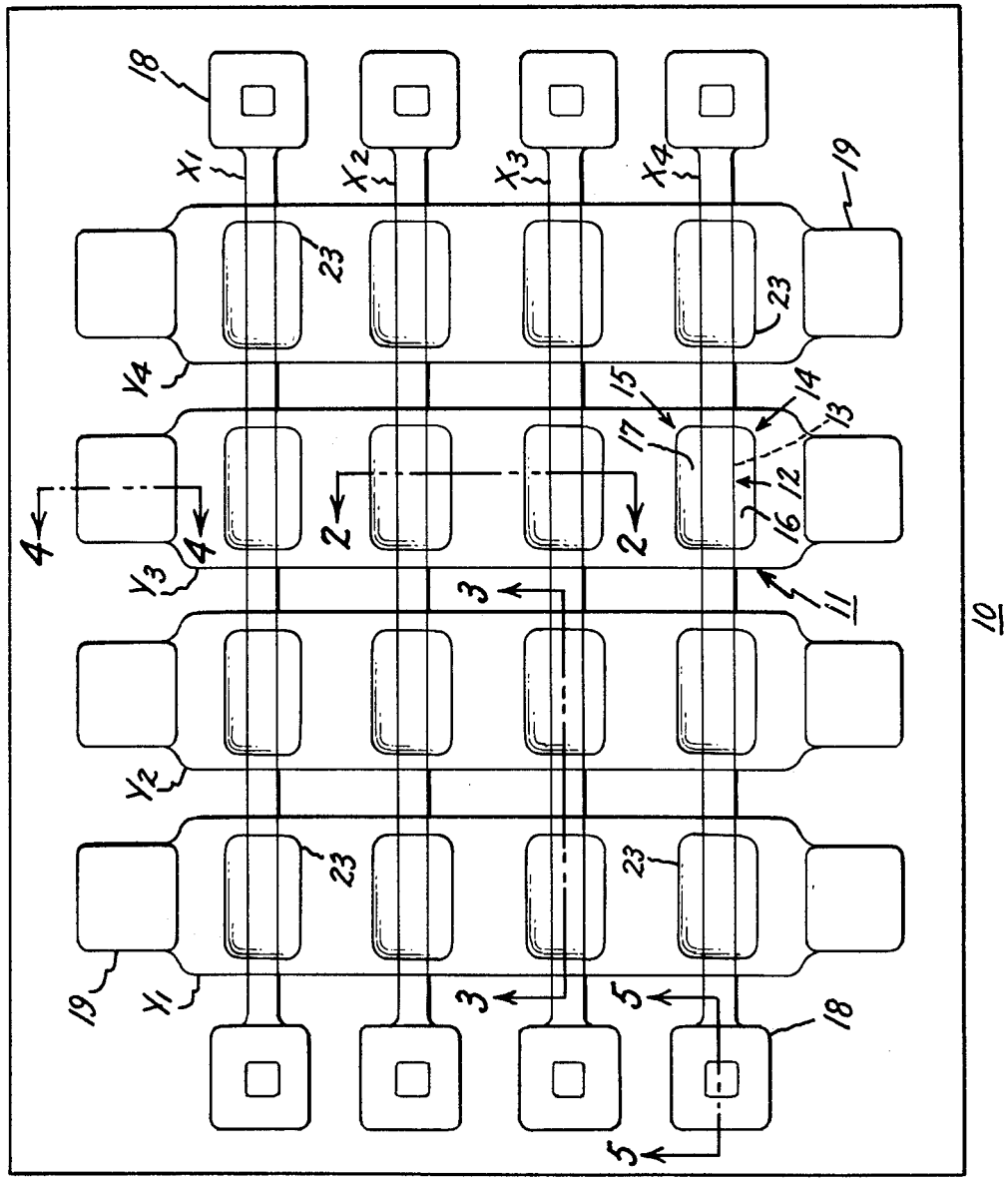

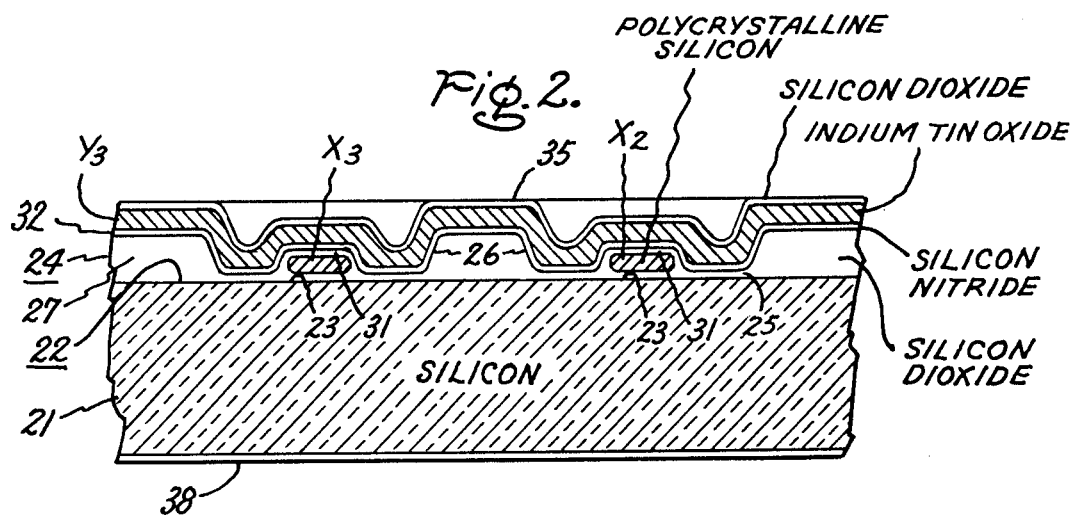
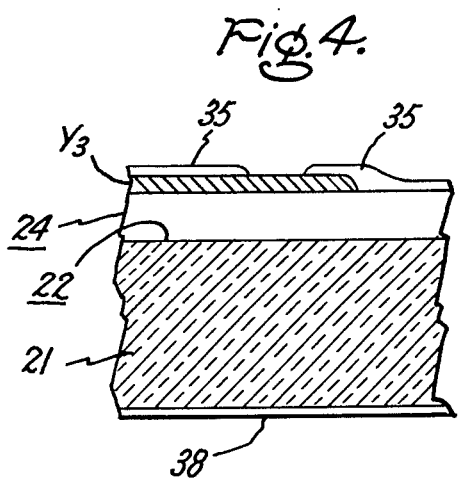

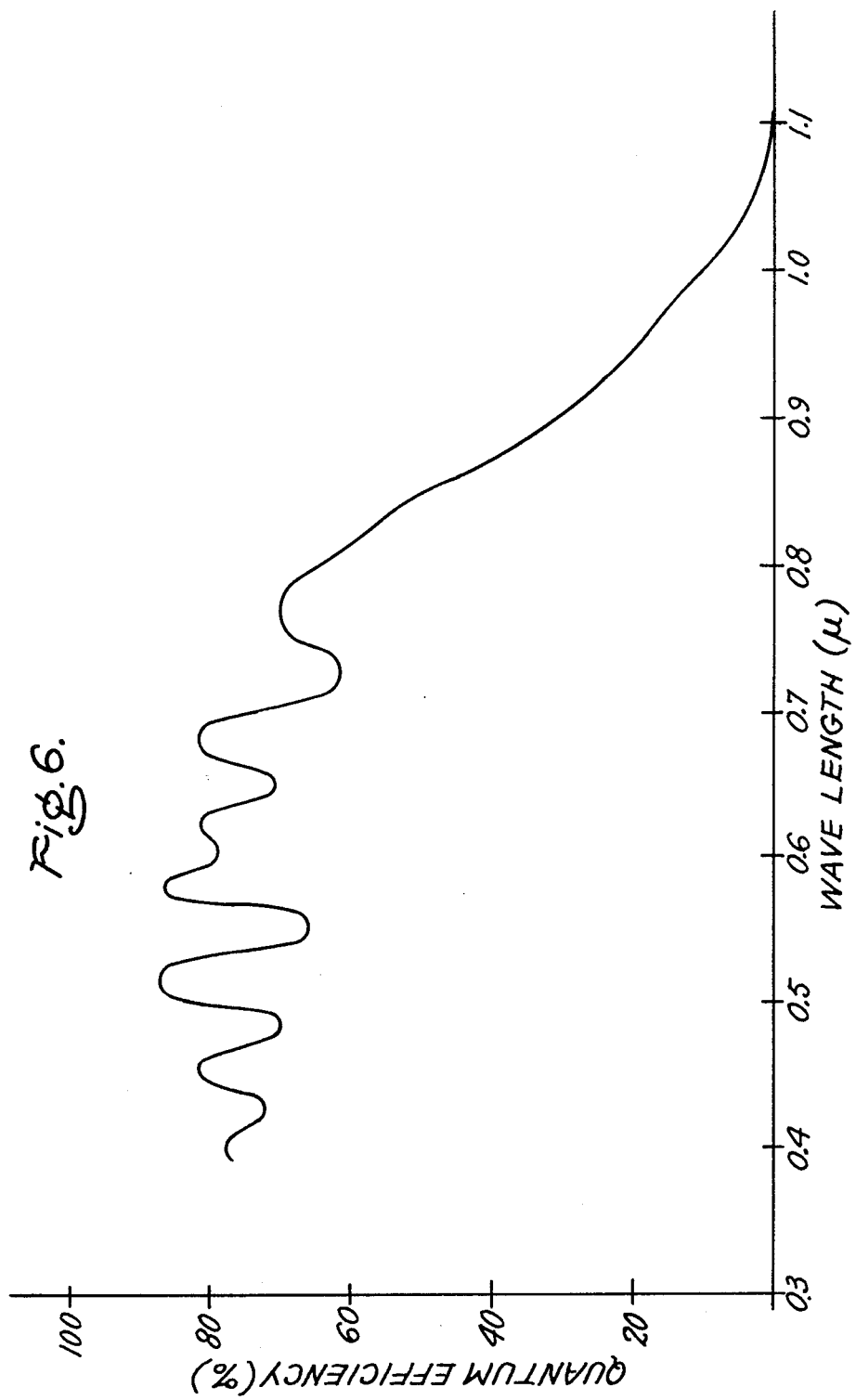

RADIATION SENSING AND CHARGE STORAGE DEVICES

The present invention relates in general to charge storage devices and in particular to such devices which sense and store charge produced by electromagnetic radiation flux and which provide an electrical readout of the stored charge.

This application relates to improvement in devices such as disclosed in U.S. Pat. No. 3,805,062, assigned to the assignee of this application. In FIGS. 13–15 of this patent are disclosed devices in a radiation sensing array in which the cells or capacitors of each device are coupled by overlapping the electrodes or conductors of the cells. In such a design slight misalignment of the electrodes of the devices resulting from misalignment of masks used in the fabrication thereof, for example, produces variations in the charge storage capacitances of the cells of the devices and alters the charge coupling efficiency between cells of a device. Also, in such an array, the use of bus lines over the thick oxide portions of the array for the column and row lines limits the density of devices which may be formed in a substrate of given size.

Accordingly, an object of the present invention is to provide improvements in radiation sensing and charge storage devices.

Another object of the present invention is to provide an array of radiation sensing and charge storage devices which is relatively simple in construction and relatively easy to fabricate.

Another object of the present invention is to provide an array of radiation sensing devices of high efficiency in conversion of radiation into electrical signals.

A further object of the present invention is to improve the performance of arrays of radiation sensing devices.

In carrying out the invention in one form there is provided a substrate of semiconductor material having a major surface in which a plurality of active surface regions of substantially identical area and outline are defined. The surface regions are arranged into a plurality of rows and columns, with each of the outlines of the surface regions being identically oriented with respect to the row and column directions. A thick layer of insulating material having a plurality of thin portions is provided overlying the major surface with each of the thin portions in registry with a respective one of the surface regions. A plurality of parallel row conductor lines of the same and uniform width overlying the layer of insulating material is provided. Each row conductor line is in traversing relationship to the surface regions of a respective row of surface regions and overlies fixed first portions of the surface regions of the respective row. A plurality of parallel column conductor lines of the same and uniform width insulated from and overlying the row conductor lines is also provided. The column conductor lines are orthogonal to the row conductor lines. Each column conductor line is in traversing relationship to the surface regions of a respective column of surface regions and overlies entirely the surface regions of the respective column. The portions of the row conductor lines overlying the surface regions constituting the conductors of a plurality of first conductor-insulator-semiconductor capacitors formed with the insulating layer and the substrate. The portions of the column conductor lines overlying the surface regions and not shielded by the row conductor lines constituting the split conductors of a plurality of second conductor-insulator-semiconductor capacitors formed with the insulating layer and the substrate. Each second conductor-insulator-semiconductor capacitor includes a pair of capacitors each coupled to a respective first conductor-insulator-semiconductor capacitor.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 is a plan view of an array or assembly of a plurality of radiation responsive cells formed on a common semiconductor substrate in accordance with the present invention.

FIG. 2 is a sectional view of the assembly of FIG. 1 taken along section lines 2—2 of FIG. 1.

FIG. 4 is a sectional view of the assembly of FIG. 1 taken along section lines 4—4 of FIG. 1.

FIG. 6 is a graph of quantum efficiency versus wavelength for the array of FIG. 1.

Figure 3:
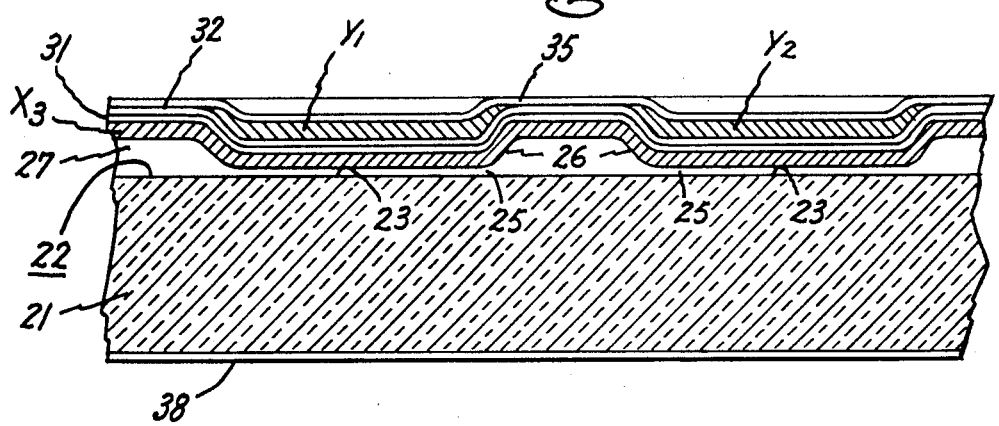
FIG. 3 is a sectional view of the assembly of FIG. 1 taken along section lines 3—3 of FIG. 1.

Reference is now made to FIGS. 1–5 which show an image sensing array 10 of radiation sensing devices 11 in accordance with the present invention. Each device 11 of the array includes a first or row CIS (Conductor-Insulator-Semiconductor) charge storage capacitor 12 of generally rectangular outline in which the plate or conductor 13 thereof is connected to and integral with the row conductor line or stripe of the row in which the device is located and a pair of column CIS charge storage capacitors 14 and 15, collectively designated as a second charge storage capacitor, also of generally rectangular outline, each adjacent a respective side of the row CIS charge storage capacitor 12 in which the plates or conductors 16 and 17 thereof are connected to and are integral with the column conductor line or stripe of the column in which the device is located. The radiation sensing devices 11 are arranged in four rows and columns. The array includes four row conductor lines or stripes, each connecting the row plates of a respective row of devices, and are designated from top to bottom $X_1$, $X_2$, $X_3$ and $X_4$. The array also includes four column conductor lines or stripes orthogonally oriented with respect to the row conductor lines, each connecting the column plates of a respective column of devices, and are designated from left to right $Y_1$, $Y_2$, $Y_3$ and $Y_4$. The row lines are constituted of a light transmissive conductive material, such as doped polycrystalline silicon and the column lines are constituted of another light transmissive conductive material, such as indium oxide doped with tin oxide, referred to as indium tin oxide. Indium tin oxide and the processing thereof is described in RCA Review Vol. 32, June 1971, on page 299 in an article entitled "RF Sputtered Transparent Conductors-The System $In_2O_3$—$SnO_2$" by John L. Vossen and also in Journal of Electrochemical Society, October 1972, on page 1368 in an article entitled "Highly Conductive, Transparent films of Sputtered $In_{2-x}Sn_xO_{3-y}$" by D. B. Fraser and H. D. Cook. Conductive connections are made to the row lines $X_1$-$X_4$ through conductive landings or contact tabs 18 provided at both ends of each of the row lines. Conductive connections are made to the column lines $Y_1$-$Y_4$ through conductive landings or contact tabs 19 provided at both ends of each of the column lines.

The array includes a substrate or wafer 21 of semiconductor material having a major surface 22 in which are provided a plurality of surfaces regions 23. The surface regions 23 are arranged into a plurality of rows and columns. The surface regions 23 are of substantially identical area and outline. As shown, the surface regions 23 are of generally rectangular outline with the long sides parallel to the row direction and the short sides parallel to the column direction. With the active surface region rectangular in outline mask alignment requirements are less exacting in an array organization in which the column lines are parallel to the long sides of the surface regions. A thick layer 24 of light transmissive insulating material overlies the major surface and has a plurality of thin portions 25, each in registry with a respective one of the surface regions 23. The thin portions are provided by forming deep recesses 26 in the thick insulating layer. Thus, the insulating layer 24 includes thick or ridge portions 27 surrounding a plurality of thin portions 25 in the bottoms of the recesses 26. A plurality of row conductor lines $X_1$-$X_4$ each of the same and uniform width are provided overlying the layer of insulation. Each row conductor line being in traversing relationship to the surface regions 23 of a respective row of surface regions and overlying fixed first portions of the surface region of the respective row. The portions of the row conductor lines overlying the surface regions 23 constituting the conductors of a plurality of first conductor-insulator-semiconductor capacitors formed with the insulating layer 25 and the substrate 21. A plurality of column conductor lines $Y_1$-$Y_4$ each of the same and uniform width are provided insulatingly overlying the row conductor lines. Each column conductor line being in traversing relationship to the surface regions 23 of a respective column of surface regions and overlying entirely the surface regions of the respective column. The portions of the column conductor lines overlying the surface regions not shielded or masked by the row conductor lines constituting the split conductors 16 and 17 of a plurality of second conductor-insulator-semiconductor capacitors formed with the thin portions 25 of the insulating layer and the substrate. Each second conductor-insulator-semiconductor capacitor including a pair of capacitors 14 and 15 both of which are coupled to a respective first conductor-insulator-semiconductor capacitor 12.

The imaging sensing array 10 and the devices 11 of which they are comprised may be fabricated using a variety of materials and in a variety of sizes in accordance with established techniques for fabricating integrated circuits. One example of an array using specific materials and specific dimensions will be described. The semiconductor starting material is a wafer of monocrystalline silicon of N-type conductivity of about 4 ohm-cm resistivity and having a major surface along the <111> crystallographic plane thereof and conveniently 10 mils thick. The insulating layer 24 comprises thermally grown silicon dioxide with the thin portions thereof having a depth of approximately 0.1 micron separately grown after etching of an initially uniform thick layer of about 1.5 microns of the thermally grown silicon dioxide to form openings therein and define the surface storage regions 23 in the major face 22 of the substrate. The row lines $X_1$-$x_4$ and the conductors of the first CIS capacitors thereof are formed of doped polycrystalline silicon. The column lines $Y_1$-$Y_4$ and the split conductors 16 and 17 of second CIS capacitors are constituted of sputtered indium tin oxide, sputtered from a source consisting of approximately 10% of tin oxide and 90% of indium oxide by weight to a thickness of about 0.5 micron. The dimensions of the active surface regions 23 of each of the devices are approximately 1.3 mils by 0.9 mil. The centers of the active regions are spaced in the horizontal or row direction approximately 1.7 mils apart and the centers of the active regions in the vertical or column direction are spaced approximately 1.3 mils apart. An insulating layer 31 of silicon dioxide of approximately 0.1 micron surrounds the row stripes or lines $X_1$-$X_4$ of polycrystalline silicon. A layer about 0.1 micron of silicon nitride 32 is provided between the column line stripes $Y_1$-$Y_4$ and the row line stripes $X_1$-$X_4$.

In the fabrication of the array a thick layer of field oxide approximately 1.5 microns thick is thermally grown on a major surface of the N-type silicon wafer of 4 ohm-cm resistivity. Openings extending to the major surface of the silicon wafer are formed in the oxide layer exposing the active surface regions 23 in the major surface using conventional photolithographic techniques and thereafter thin portions 25 of silicon oxide approximately 0.1 micron thick are thermally grown over the active surface regions. A layer of polycrystalline silicon is vapor deposited by decomposition of silane to a thickness of approximately 0.5 micron. Thereafter, the polycrystalline silicon is doped highly conductive N-type using phosphorous oxychloride vapor. The polycrystalline silicon layer is then pattened into the stripes which form the row conductors of the devices 11 as well as the row conductor lines $X_1$-$X_4$ thereof. After removal of the patterning oxide from the polycrystalline silicon stripes thermal oxide 31 is grown on polycrystalline lines to a thickness of approximately 0.1 micron.

In order to protect the active surface regions of the substrate as well as the thermally grown oxide overlying the active surface regions from environmental contamination and also to assure good electrical isolation of the row and column lines, a layer of silicon nitride 32 approximately 0.1 micron thick is chemically vapor deposited using silane and ammonia in a hydrogen atmosphere. The silicon nitride layer 32 is suitably patterned to cover just the area of the array in which the devices 11 are located and not the regions underlying the contact tabs 18 and 19. After formation of the silicon nitride layer, a layer of indium tin oxide approximately 0.5 micron thick is formed on the array by sputtering. To this end the wafer is placed in conventional r-f sputtering apparatus in which the target electrode is a ceramic disc of approximately 90% indium oxide and 10% tin oxide by weight. After deposition the indium tin oxide layer is annealed to improve the conductivity thereof. The layer of indium tin oxide is then patterned using photolithographic masking and etching techniques into the column stripes. A suitable technique for patterning the indium tin oxide layer is described in patent application Ser. No. 573,843, filed May 2, 1975 and assigned to the assignee of the present invention. A layer 35 of silicon dioxide approximately 0.2 micron thick is then formed over the indium tin oxide stripes by chemical vapor deposition using silane and oxygen. The silicon dioxide is suitably patterned to cover the device area of the array. The silicon dioxide layer 35 provides protection for indium tin oxide layers in connection with further processing of the array, for example, in connection with the processing of other circuits which may be located on the same substrate. The silicon dioxide layer 35 having an index of refraction of 1.4 also provides a matching layer between air having an index of refraction of 1 and the indium tin oxide layers having an index of refraction of 2 which minimizes reflection of light incident on the array.

Figure 5:
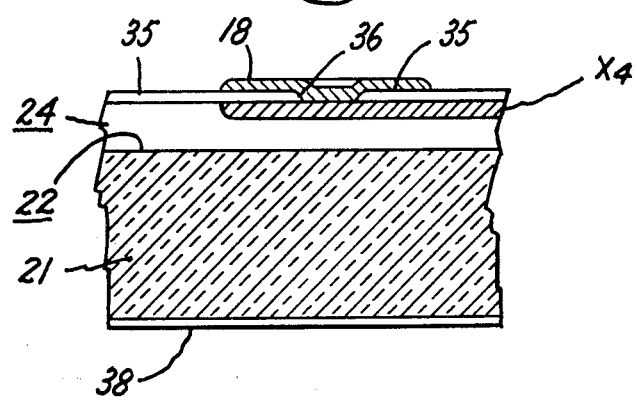
FIG. 5 is a sectional view of the assembly of FIG. 1 taken along section lines 5—5 of FIG. 1.

The manner of forming the contacts or tabs 18 for the polycrystalline silicon row lines is illustrated in FIG. 5. Openings 36 are etched in the silcon dioxide protective layer 35 where contacts are desired to the polycrystalline silicon lines. Thereafter aluminum is evaporated over the openings to a suitable thickness and patterned to form the row line tabs. The aluminum is then sintered to bond it to the polycrystalline silicon lines $X_1$-$X_4$.

The manner of forming contacts or tabs 19 for the column lines is illustrated in FIG. 4. Openings are etched in the silicon dioxide protective layer 35 where the contacts are desired using photolithographic masking and etching techniques to expose the surface of the indium tin oxide column lines and form the contact tabs.

A conductive electrode 38 of a suitable material such as aluminum is applied to the other major face of the substrate to provide an ohmic connection thereto.

The image sensing array of FIGS. 1–5 can be operated in the system shown in FIG. 11 of the above-referenced patent as well as in other ways, as desired.

While the invention has been described in connection with an array of 16 devices, it is readily apparent that arrays of many more devices can be readily constructed in accordance with the invention. Also, the devices of the array may be organized in arrangements other than the one shown.

Reference is now made to FIG. 6 which shows a graph of quatum efficiency versus wavelength for an image sensing array such as shown in FIGS. 1–5 in which 32 rows and 32 columns of devices were provided. Quantum efficiency is the ratio of carriers collected from the array to photons incident on the array expressed in a percentage. The high and nearly constant efficiency in the visible band of wavelengths is due to the fact that the major portion of the array is covered by indium tin oxide electrodes and photon conversion can occur in the underlying depletion layer of each device. The array has excellent blue response nearly uniform spectral response from 4000 to 8000 Angstrom units and very high sensitivity, i.e. about 70% quantum efficiency.

While in the array described in connection with FIGS. 1–5 the major surface of the semiconductor substrate is shown as essentially planar and the outer surface of the insulating layer is shown as having a plurality of wells therein, it is readily apparent to those skilled in the art that the active surface regions of the semiconductor substrate underlying the capacitor electrodes may be planar and elevated from the non active surface portions of the substrate. The insulating layer provided over such a substrate surface would have a planar exterior surface and accordingly column stripes or lines $Y_1$ through $Y_4$ would lie in a plane and could be more easily so formed.

Indium tin oxide is a desirable material for the column lines as it transmits a large percentage (about 80% for layers about 0.5 micron thick) of the visible light penetrating its surface, as it can be made to provide relatively high conductivity, and as it is a semiconductor with a wide band gap and hence its band pass characteristic holds up over the blue end of the visible spectrum. In addition, as the index of refraction of the stripes of indium tin oxide ($n$=2) is intermediate between the indices of refraction of the layer of silicon dioxide ($n$=1.4) lying on the stripes of indium tin oxide and the silicon substrate ($n$=3.5 to 5.5 dependent on wavelength), an improved match of the indices of refraction is obtained resulting in minimizing reflection of light incident on the array. Other light transmission materials having good light transmission properties as well as high conductivity may be utilized in place of indium tin oxide, for example, antimony tin oxide ($n$=2).

In view of the lower light transmissivity of polycrystalline silicon (30% to 50% dependent on wavelength) of visible light the width of the row lines is kept to a minimum consistent with providing good conductivity in the row lines and sufficient capacitance in the row or first storage capacitors of the devices of the array in order to maintain good sensitivity. In FIG. 1 a row lines covers about one-third of the active surface regions of a device.

As the index of refraction of silicon ($n$=3.5 to 5.5 dependent on wavelength) is substantially higher than for indium tin oxide or the insulating materials used substantially, reflections of incident radiation occur due to the presence of silicon in the layered structure. Accordingly, reducing the area covered by silicon electrodes also improves the sensitivity of the array. If desired other light transmissive materials could be used in place of polycrystalline silicon.

While a layer of silicon nitride has been utilized in the array of FIGS. 1–5, it is apparent that if desired this layer may be eliminated and the insulating layer made entirely of silicon oxide or other transparent materials such as aluminum oxide.

While the invention has been shown in connection with an imaging array the invention is applicable as well to memory arrays in which case the column and row electrodes need not be constituted of light transmissive material. Whether a device of the invention is used in imaging arrays, in memory arrays, in other arrangements, or as an individual device, the organization of the elements thereof is particularly advantageous in that a pair of coupled capacitors is provided with a fixed ratio of capacitances dependent on the separation of a pair of parallel sides of the rectangular active surface region of the substrate and the width of the conductor included between those two sides.

While the invention has been described in connection with arrays made of silicon semiconductor material, it is understood that the invention is equally applicable to arrays made of other semiconductor materials, such as germanium, gallium phosphide and gallium arsenide.

While the invention has been described in specific embodiments, it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the United States is:

1. A radiation sensing array comprising a substrate of semiconductor material having a major surface, said substrate having a plurality of active surface regions lying in said major surface and arranged into a plurality of rows and columns, said active surface regions being of substantially identical area and outline, the outlines of said active surface regions being identically oriented with respect to the directions of said rows and columns, a thick layer of insulating material overlying said major surface having a plurality of thin portions, each in registry with a respective one of said active surface regions, a plurality of parallel row conductor lines, each of the same and uniform width overlying said layer of insulating material, each row conductor line being in traversing relationship to the active surface regions of a respective row of active surface regions and overlying identical first portions of the active surface regions of a respective row, a plurality of parallel column conductor lines of the same and uniform width insulatingly overlying said row conductor lines, each column conductor line being in traversing relationship to the active surface regions of a respective column of active surface regions and overlying entirely the active surface regions of the respective column, said column lines being orthogonal to said row lines, the portions of said row conductor lines overlying said active surface regions consituting the conductors of a plurality of first conductor-insulator-semiconductor capacitors formed with said insulating layer and said substrate, the portions of said column conductor lines overlying said active surface regions and unshielded from said surface regions by said row conductor lines consituting the split conductors of a plurality of second conductor-insulator-semiconductor capacitors formed with said insulating layer and said substrate, each second conductor-insulator-semiconductor capacitor including a pair of capacitors each coupled to a respective first conductor-insulator-semiconductor capacitor.

2. The array of claim 1 in which said column conductor lines are constituted of a first light transmissive conductive material.

3. The array of claim 2 in which said transparent conducting material is selected from the class of indium tin oxide and antimony tin oxide.

4. The array of claim 2 in which said first transmissive conductive material is indium tin oxide.

5. The array of claim 4 in which said indium tin oxide consists of approximately 90 percent indium oxide and the remainder tin oxide.

6. The array of claim 2 in which said insulating material is selected from the class of silicon dioxide, silicon, nitride, mixtures of silicon dioxide and silicon nitride, and aluminum oxide and in which said semiconductor material is silicon.

7. The array of claim 2 in which said row conductor lines are consitituted of a second light transmissive conductive material.

8. The array of claim 1 in which said surface regions are generally rectangular in outline, one pair of parallel sides of said outline being parallel to said column lines.

9. The array of claim 8 in which said one pair of sides are the long sides of said outline.

10. The array of claim 1 in which the area of each of the active surface regions underlying a respective row conductor being substantially less than one-half the total area of an active surface region.

11. The radiation sensing array of claim 1 in which said thick layer of insulating material includes a sublayer of silicon nitride situated between said column conductor lines and said row conductor lines.

* * * * *